(12) United States Patent
Huang et al.

(10) Patent No.: US 9,799,620 B2
(45) Date of Patent: Oct. 24, 2017

(54) WARPAGE REDUCTION AND ADHESION IMPROVEMENT OF SEMICONDUCTOR DIE PACKAGE

(71) Applicant: Taiwan Semiconductor Manufacturing Company, Ltd., Hsin-Chu (TW)

(72) Inventors: Yu-Chih Huang, Hsin-Chu (TW); Yen-Chang Hu, Tai-Chung (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/788,304

(22) Filed: Jun. 30, 2015

(65) Prior Publication Data

US 2015/0303158 A1     Oct. 22, 2015

Related U.S. Application Data (62) Division of application No. 13/790,739, filed on Mar. 8, 2013, now Pat. No. 9,087,832.

(51) Int. Cl.

| H01L 23/00 | (2006.01) |
|---|---|
| H01L 23/498 | (2006.01) |
| H01L 21/48 | (2006.01) |
| H01L 23/538 | (2006.01) |
| H01L 21/56 | (2006.01) |

(52) U.S. Cl.
CPC ............ H01L 24/11 (2013.01); H01L 21/486 (2013.01); H01L 21/563 (2013.01);
(Continued)

(58) Field of Classification Search
CPC . H01L 2224/12105; H01L 2924/18162; H01L 2924/181
See application file for complete search history.

(56) References Cited

U.S. PATENT DOCUMENTS

| 5,976,710 A | 11/1999 | Sachdev et al. |
|---|---|---|
| 2008/0197513 A1* | 8/2008 | Restaino ........... H01L 21/76822 257/784 |

(Continued)

OTHER PUBLICATIONS

Kubacki ("Low Temperature Plasma Deposition of Silicon Nitride to Produce Ultra-Reliable, High Performance, Low Cost Sealed Chip-on-Board (SCOB) Assemblies" © 1994 IEEE p. 273).*

(Continued)

*Primary Examiner* — Marc Armand
*Assistant Examiner* — Sue Tang
(74) *Attorney, Agent, or Firm* — Slater Matsil, LLP (57) ABSTRACT

A method of forming a die package includes forming a conductive column over a first side of a carrier, attaching a semiconductor die to the first side of the carrier, and forming a molding compound over the first side of the carrier. The semiconductor die and the conductive column are embedded in the molding compound. A second side of the carrier opposite the first side is under a compressive stress. The method also includes forming a first compressive dielectric layer over the semiconductor die, the conductive column, and the molding compound, forming a first redistribution layer (RDL) over the first compressive dielectric layer, and forming a first passivation layer over the first RDL.

20 Claims, 7 Drawing Sheets

(52) U.S. Cl.
CPC .. *H01L 23/49822* (2013.01); *H01L 23/49827* (2013.01); *H01L 23/5389* (2013.01); *H01L 24/19* (2013.01); *H01L 23/49816* (2013.01); *H01L 2224/02317* (2013.01); *H01L 2224/04105* (2013.01); *H01L 2224/12105* (2013.01); *H01L 2224/16225* (2013.01); *H01L 2224/32225* (2013.01); *H01L 2224/73204* (2013.01); *H01L 2224/73267* (2013.01); *H01L 2924/1305* (2013.01); *H01L 2924/13091* (2013.01); *H01L 2924/181* (2013.01); *H01L 2924/18162* (2013.01)

(56) References Cited

U.S. PATENT DOCUMENTS

| | | | | |
|---|---|---|---|---|
| 2009/0309212 A1* | 12/2009 | Shim | ............... | H01L 21/568 257/700 |
| 2010/0258868 A1* | 10/2010 | Yin | ............... | H01L 29/0653 257/347 |
| 2013/0049218 A1* | 2/2013 | Gong | ............... | H01L 24/19 257/774 |

OTHER PUBLICATIONS

"Interfaces and Stresses in Thin Films" Spaepen, Acta mater. 48 (2000) 31-42, Jun. 1999.*

* cited by examiner

WARPAGE REDUCTION AND ADHESION IMPROVEMENT OF SEMICONDUCTOR DIE PACKAGE

CROSS-REFERENCE TO RELATED APPLICATIONS

This application is a divisional of and claims the benefit of U.S. patent application Ser. No. 13/790,739, filed on Mar. 8, 2013, entitled "Warpage Reduction and Adhesion Improvement of Semiconductor Die Package," which relates to commonly assigned provisional patent application: Ser. No. 61/726,411, entitled "Warpage Control of Semiconductor Die Package" and filed on Nov. 14, 2012, which applications are incorporated herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more die packages, each including one or more semiconductor dies, are formed. The die packages are then bonded together. Through package vias (TPVs), also referred to as through molding vias (TMVs), through assembly vias (TAVs) or through substrate vias (TSVs), are increasingly used as a way of implementing 3D ICs. TPVs are often used in 3D ICs and stacked dies to provide electrical connections and/or to assist in heat dissipation. There are challenges in forming 3D ICs of stacked packaged dies.

Figure 1A:
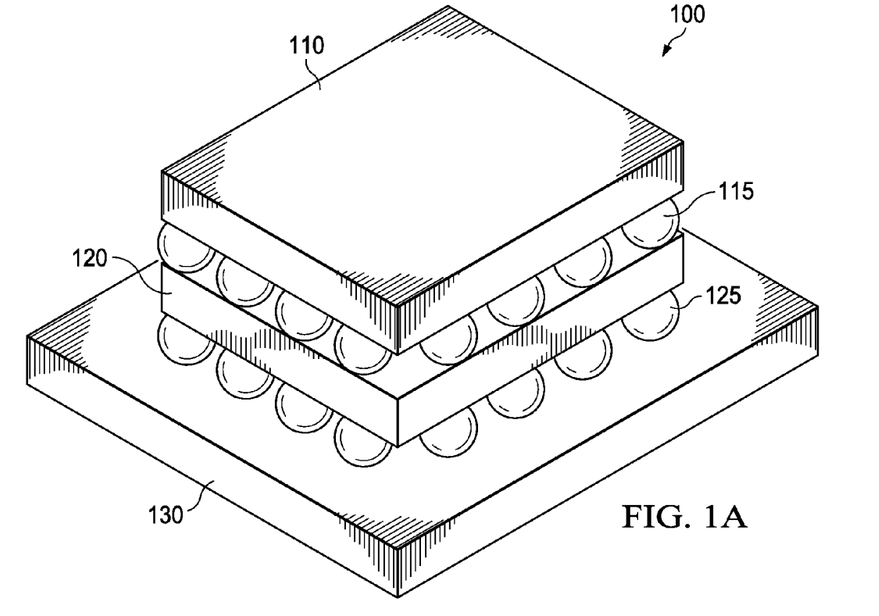
FIG. 1A is a perspective view of a package structure, in accordance with some embodiments.

FIG. 1A is a perspective view of a package structure 100 including a package 110 bonded to another package 120, which is further bonded to another substrate 130 in accordance with some embodiments. Each of die packages 110 and 120 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O)

device, system-on-chip (SoC) device, combinations thereof, and other suitable types of devices. Package 120 includes through substrate vias (TPVs) and function as an interposer, in accordance with some embodiments.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Package 110 is bonded to package 120 via connectors 115, and package 120 is bonded to substrate 130 via external connectors 145. In some embodiments, the external connectors 145 are bonded bump structures, such as bonded solder bumps, or bonded copper posts with a joining solder layer.

Figure 1B:
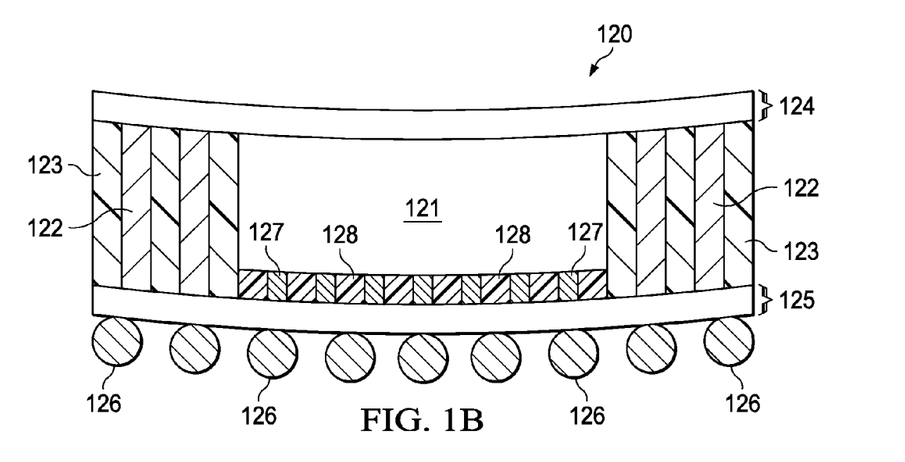
FIG. 1B show a cross-sectional view of a die package, in accordance with some embodiments.

FIG. 1B show a cross-sectional view of die package 120, in accordance with some embodiments. Package 120 includes a semiconductor die 121 and TPVs 122, which surround die 121 and are located near the edges of package 120. Package 120 also includes a first redistribution structure 124 and a second redistribution structure 125. Each of first redistribution structure 124 and second redistribution structure 125 includes one or more redistribution layers (RDLs), which are metal interconnect layers and are surrounded by dielectric material(s). As shown in FIG. 1B, TPVs 122 are connected to both first redistribution structure 124 and second redistribution structure 125. Die 121 is connected to first redistribution structure 124 on one side and to second redistribution structure 125 on the other side via connectors 127. In some embodiments, connectors 127 are surrounded by a molding compound 128. In some embodiments, molding compound 128 is made of a polymer, such as epoxy, polyimide, polybenzoxazole (PBO), etc. In some embodiments, the molding compound 128 includes solid fillers, such as silica, or other applicable materials, to increase its strength. In some embodiments, connectors 127 are surrounded by an underfill, instead of a molding compound.

The RDLs in first redistribution structure 124 and second redistribution structure 125 enable fan-out of die 121. Package 110 bonded to package 120 may include one or more dies, which may be placed beyond the boundary of die 121 due to fan-out enabled by first redistribution structure 124. The second redistribution structure 125 is connected to contact structures 127, such as conductive bumps. In some embodiments, the conductive bumps include copper posts. The space between first redistribution structure 124 and second redistribution structure 125 is filled with a molding compound 123. In some embodiments, the molding compound 123 is made of a polymer, such as epoxy. In some embodiments, the molding compound 123 includes a filler, such as silica, to increase strength of the molding compound 123.

Due to varying coefficients of thermal expansion (CTEs) of different elements on package 120, package 120 bows upward at the edges, as shown in FIG. 1B in accordance with some embodiments. The way package 120 bows (or warps) upward at the edges is similar to die bowing due to having a tensile film on the die. Such bowing (or warpage) is not desirable for forming package on package (PoP) structure, because bowing could cause metal/dielectric interfacial delamination to affect reliability of connections between 120 and 110. In addition, bowing of package 120 could break portions of RDLs in first redistribution structure 124 and/or second redistribution structure 125 to degrade yield. Therefore, it is desirable to reduce bowing during formation of package 120.

Figure 2A:
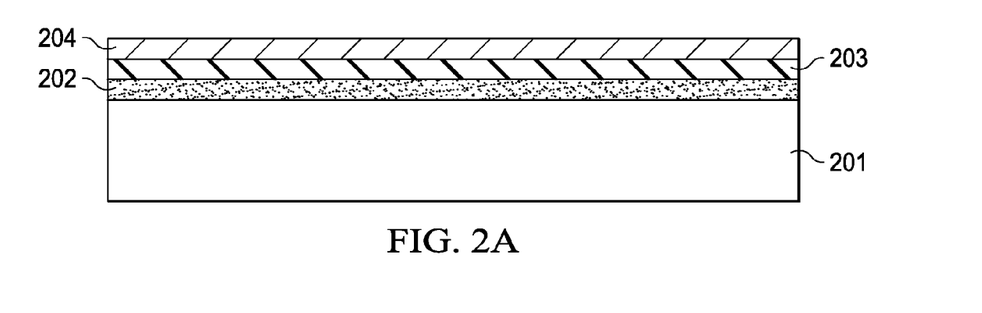
FIGS. 2A-2I show cross-sectional views of a sequential process flow of preparing a die package, in accordance with some embodiments.

FIGS. 2A-2I show cross-sectional views of a sequential process flow of preparing a die package 120', in accordance with some embodiments. Package 120', which is similar to package 120, has less bowing than package 120 described above in FIG. 1B. In some embodiments, package 120' has no observable bowing. FIG. 2A shows an adhesive layer 202, which is over carrier 201. Carrier 201 is made of glass, in accordance with some embodiments. However, other materials may also be used for carrier 201. Adhesive layer 202 is deposited or laminated over carrier 201, in some embodiments. Adhesive layer 202 may be formed of a glue, or may be a lamination layer formed of a foil. In some embodiments, adhesive layer 202 is photosensitive and is easily detached from carrier 201 by shining ultra-violet (UV) light on carrier 201 after package 120' is formed. For example, adhesive layer 202 may be a light-to-heat-conversion (LTHC) coating made by 3M Company of St. Paul, Minn.

A cushion layer 203 is then formed over the adhesive layer. The cushion layer 203 is dielectric and is made of a polymer, such as polyimide, polybenzoxazole (PBO), or benzocyclobutene (BCB), in some embodiments. In some embodiments, the cushion layer 203 has thickness in a range from about 5 µm to about 10 µm. After the cushion layer 203 is formed, a diffusion barrier and copper seed dual layer 204 is formed on the cushion layer 203. In some embodiments, the diffusion barrier layer is made of Ti and the copper seed layer is made of copper. However, the diffusion barrier layer may be made of other materials, such as TaN, or other applicable materials. The dual layer 204 is formed by a physical vapor deposition process, or sputter process in accordance with some embodiment. In some embodiments, the diffusion barrier layer has thickness in a range from about 0.05 µm to about 0.1 µm. In some embodiments, the copper seed layer has thickness in a range from about 0.3 µm to about 0.5 µm.

Figure 2B:
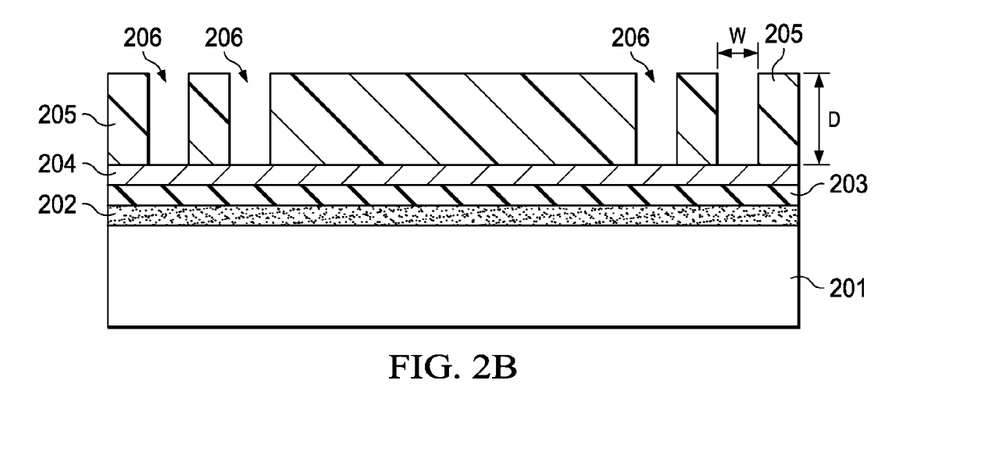

Following the deposition of the dual layer 204, a photoresist layer 205 is formed over dual layer 204, as shown in FIG. 2B in accordance with some embodiments. The photoresist layer 205 may be formed by a wet process, such as a spin-on process, or by a dry process, such as by a dry film. After the photoresist layer 205 is formed, the photoresist layer 205 is patterned to formed openings 206, which are filled to form TSVs 122 described above in FIG. 1B. The processes involved include photolithography and resist development. In some embodiments, the width W of openings 206 is in a range from about 40 µm to about 90 µm. In some embodiments, the depth D of openings 206 is in a range from about 80 µm to about 120 µm.

Figure 2C:
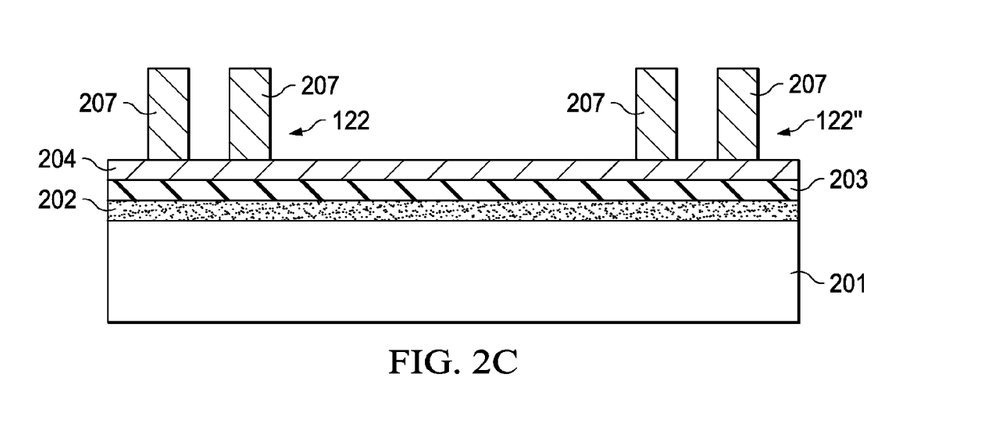

Afterwards, a copper-containing conductive layer 207 is plated to fill openings 206, in accordance with some embodiments. The copper-containing conductive layer 207 may be made of copper or copper alloy. In some embodiments, the thickness of the copper-containing layer 207 deposited is in a range from about 80 µm to about 120 µm. Following the plating to gap-fill process, a planarization process, such as chemical-mechanical polishing (CMP) process is applied on carrier 201 to remove excess copper-containing conductive layer 207 outside openings 206. After the excess copper-containing conductive layer 207 is removed, the photoresist layer 205 is removed by an etching process, which may be a dry or a wet process. FIG. 2C shows a cross-sectional view of the structure on carrier 201 after the photoresist layer 205 is removed and conductive material in the openings 206 are exposed as (conductive) columns 122", in accordance with some embodiments.

Figure 2D:
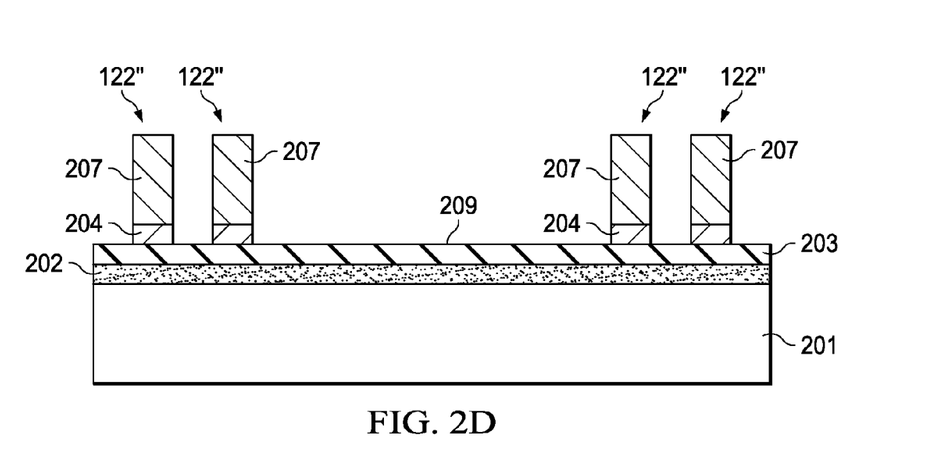
Figure 2E:
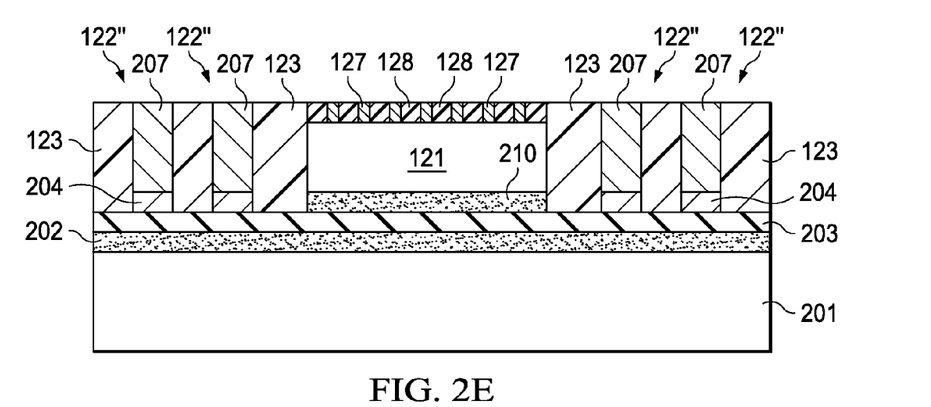

Following the removal of photoresist layer 205, the exposed diffusion barrier and copper seed dual layer 204 is removed to prevent shorting between columns 122", as shown in FIG. 2D in accordance with some embodiments. Afterwards, semiconductor die 121 is attached to a surface 209 over carrier 201 by a glue layer 210, as shown in FIG. 2E in accordance with some embodiments. Glue layer 210 is made of a die attach film (DAF), in accordance with some embodiments. DAF may be made of epoxy resin, phenol resin, acrylic rubber, silica filler, or a combination thereof. FIG. 2E show that connectors 127 are facing away from the surface 209. A liquid molding compound material is then applied on the exposed surface over carrier 201 to fill the space between columns 122 and die 121 and to cover die 121 and columns 122". A thermal process is then applied to harden the molding compound material and to transform it into molding compound 123. Columns 122 become TPVs 122 after the molding compound 123 is formed to surround them.

Afterwards, a planarization process is applied to remove excess molding compound 123 to expose TPVs 122 and connectors 127 of die 121, as shown in FIG. 2E in accordance with some embodiments. In some embodiments, the planarization process is a grinding process. Following the planarization process described above, a second redistribution structure 125' is formed, as will be described in more detail below. As described above, a redistribution structure, such as first redistribution structure 124 or second redistribution structure 125, includes one or more redistribution layers (RDLs), which are metal interconnect layers and are surrounded by dielectric material(s). The RDL(s) is insulated by one or more dielectric layers, which are called passivation layers. In some embodiments, passivation layers are made of polymers, such as polyimide, polybenzoxazole (PBO), or benzocyclobutene (BCB). Passivation layers made of polymers further increase warpage (or bowing) of the die package, as illustrated and described in FIG. 1B.

As mentioned earlier, the way die package, such as package 120, bows (or warps) upward at the edges is similar to die bowing due to having a tensile film on the die. Such bowing (or warpage) is not desirable for forming package on package (PoP) structure, because bowing could cause metal/dielectric interfacial delamination to affect reliability of connections between die packages. Further, bowing of die package could break portions of RDLs in redistribution structures to degrade yield. As mentioned above, it is desirable to reduce bowing during formation of die package.

Figure 2F:
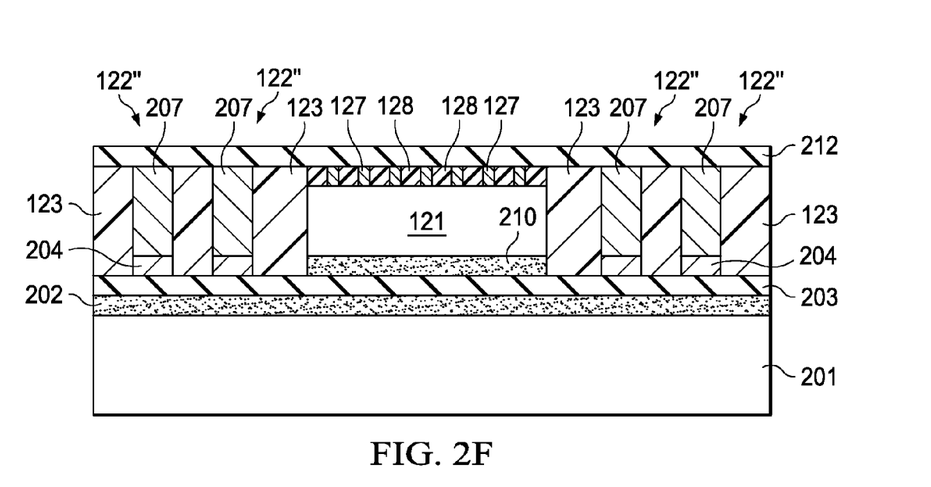

A compressive dielectric layer 212 is formed on post-planarization surface 211 as a passivation layer, as shown in FIG. 2F in accordance with some embodiments. The stress and film thickness of the compressive dielectric layer 212 are tuned to counter the bowing effect described above. In some embodiments, the compressive dielectric layer 212 is made of SiN by plasma-enhanced chemical vapor deposition (PECVD). For example, a compressive SiN layer may be formed by a low-temperature (LT) PECVD process at about 250° C. A low-temperature PECVD is preferred due to existing metal structures on carrier 201. Metal structures that include copper, copper alloy, or aluminum could deform at temperature close to or above 400° C. However, other dielectric films, such as SiON, which can be deposited with compressive stress may also be used. The compressive stress of dielectric layer 212 reduces warpage or bowing of the die package. In some embodiment, the stress of the compressive dielectric layer 212 is in a range from about 300 MPa to about 700 MPa. The thickness of layer 212 is in a range from about 0.5 μm to about 7 in accordance with some embodiments.

The compressive dielectric layer 212, formed by a PECVD process adheres well to molding compound 123 and the copper-containing conductive layer 207 that come in contact with layer 212. The adhesion between compressive dielectric layer 212 and molding compound 123 and conductive layer 207 is better than the adhesion between a polymer passivation layer and molding compound 123 and conductive layer 207. Without being limited to any particular theory of operation, it is believed that the plasma in the PECVD process may play a role in treating the surfaces of molding compound 123 and conductive layer 207 to improve the adhesion.

Figure 2G:
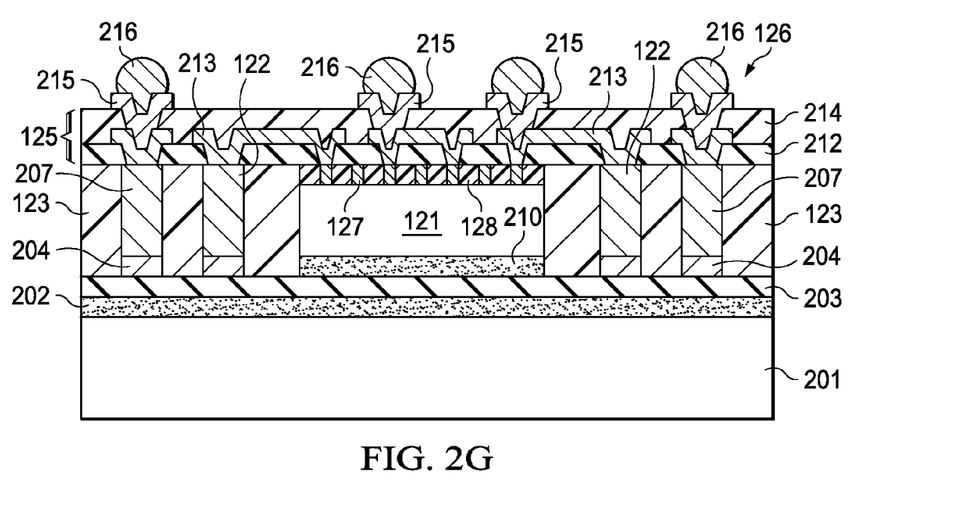

After compressive dielectric layer 212 is formed, a first RDL 213 is formed over layer 212, as shown in FIG. 2G in accordance with some embodiments. The formation of RDL 213 involves patterning the dielectric layer 212 to form openings in layer 212 to enable direct contact with conductive layer 207 of TPVs 122 and connectors 127 coupled to die 121. The RDL 213 is made of a conductive material and directly contacts TPVs 122 and connectors 127 of die 121. In some embodiments, the RDL 213 is made of aluminum, aluminum alloy, copper, or copper-alloy. However, RDL 213 may be made of other types of conductive materials. The formation of RDL 213 also involves depositing a metal layer and patterning the metal layer to form RDL 213.

After RDL 213 is formed, a polymer-based passivation layer 214 is formed over RDL 213. The polymer-based passivation layer 214 may be made of polymers, such as polyimide, polybenzoxazole (PBO), or benzocyclobutene (BCB). The polymer-based passivation layer 214 can protect the die package and absorb stress induced on the die package during bonding with another die package. The polymer-based passivation layer 214 is then patterned to expose portions of RDL 213 to enable external connectors to connect RDL 213. Compressive dielectric layer 212, RDL 213 and polymer-based passivation layer 214 are part of the second redistribution layer 125.

Following the formation of second redistribution layer 125, external connectors 126 are formed over second redistribution layer 125, as shown in FIG. 2G. FIG. 2G also shows that external connectors 126 include contact pads 215 with solder balls 216. In some embodiments, a under bump metallurgy (UBM) layer (not shown) is formed between the interface between RDL 213 and contact pads 215. The UBM layer also lines the sidewalls of openings of passivation layer 214 used to form contact pads 215. In some embodiments, RDL 213 and contact pads 215 are made of aluminum, aluminum alloy, copper, or copper-alloy. RDL 213 and contact pads 215 can be made of different materials. For example, RDL is made or aluminum and contact pads 215 are made of copper, and vice versa.

The external connectors 126 with contact pads 215 and solder balls 216 described above are merely examples. Other external connectors may also be used. Exemplary details of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 2H:
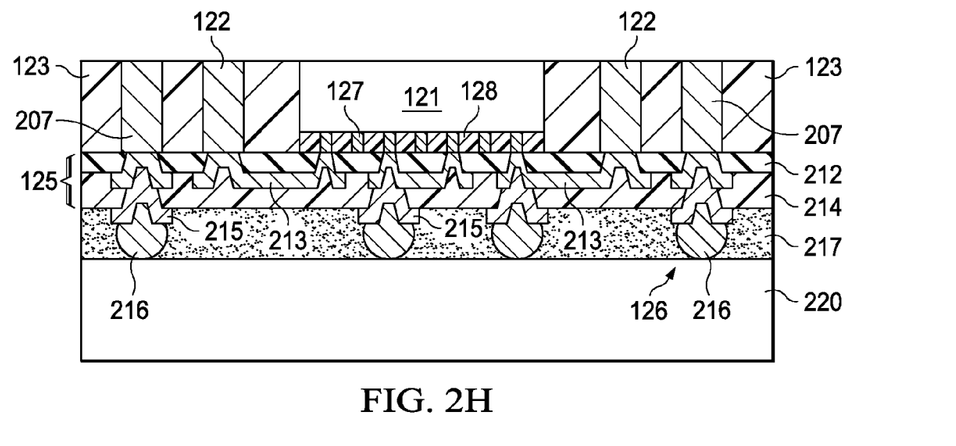

After the external connectors 126 are formed, a glue 217 is applied on the surface of external connectors 126 of structure of FIG. 2G and the structure is flipped to be glued to another carrier 220, as shown in FIG. 2H in accordance with some embodiments. The cushion layer 203, the dual layer 204, and the glue layer 210 are removed to expose TPVs 122 and die 121 by a planarization process. In some embodiments, the planarization process is a grinding process.

Figure 2I:
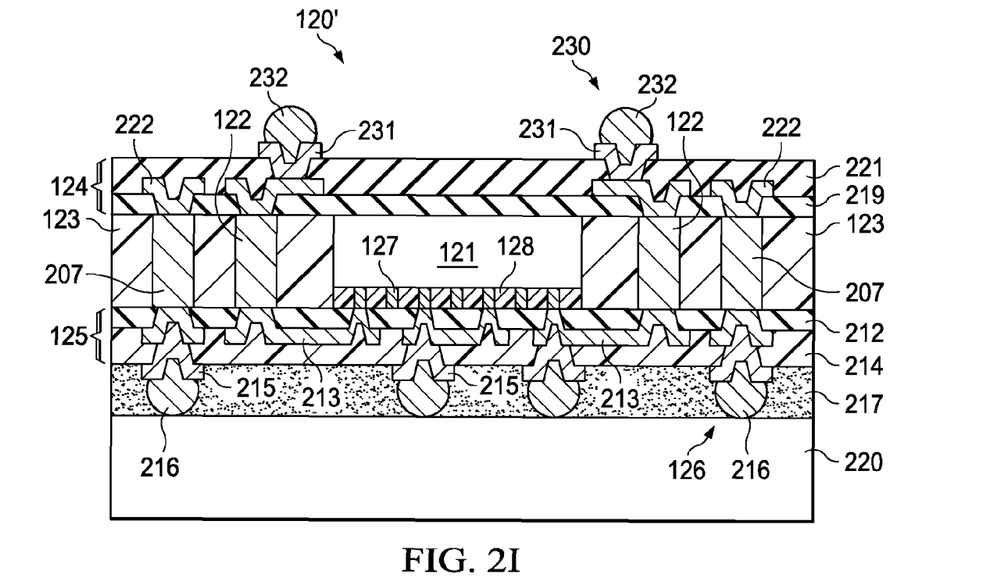

Following the planarization process, the first redistribution layer 124 is formed over surface 218 of molding compound of FIG. 2H, as shown in FIG. 2I in accordance with some embodiments. FIG. 2I shows that the first redistribution layer 124 include a RDL 222, which is sandwiched between two passivation layers 219 and 221. The RDL 222 is made of a conductive material and directly contacts TPVs 122. In some embodiments, the RDL 222 is made of aluminum, aluminum alloy, copper, or copper-alloy. However, RDL 222 may be made of other types of conductive materials. The passivation layers 219 and 221 are made of dielectric material(s) and provide stress relief for bonding stress incurred during bonding with package die 110. In some embodiments, the passivation layers 219 and 221 are made of polymers, such as polyimide, polybenzoxazole (PBO), or benzocyclobutene (BCB). In some embodiments, passivation layer 219 is made of a compressive dielectric material similar to compressive dielectric layer 212 described above. The ranges of film stress and thickness of the compressive dielectric material also help reducing warpage (or bowing) of die package formed.

External connectors 230 are be formed over the first redistribution structure 124, in accordance with some embodiments. In some embodiments, external connectors 230 include contact pads 231 and solder balls 232, which are formed over passivation layer 221 to contact RDL 222.

The structure above carrier 220 is then removed from carrier 220 and the glue layer 217 is also removed. The structure above carrier 220 could include multiple die packages 120', in accordance with some embodiments. After being removed from carrier 220, the structure may be attached to a tape to undergo sawing to singulate die packages 120' into individual die, as shown in FIG. 2I in accordance with some embodiments.

As shown in FIG. 2I, die package 120' does not bow upward or downward at the edges, in accordance with some embodiments. In some embodiments, package 120' exhibit small degree of bowing. However, the degree of bowing is much reduced compared to similar die package formed without the compressive dielectric layers. Package 120' described above is merely an example. In some embodiments, only layer 212 of redistribution structure 125 is made of a compressive dielectric film and layer 219 of redistribution structure 124 is a polymer-based passivation layer. The degree of bowing or warpage is reduced by using a compressive dielectric layer in one of the two redistribution structures.

Figure 3A:
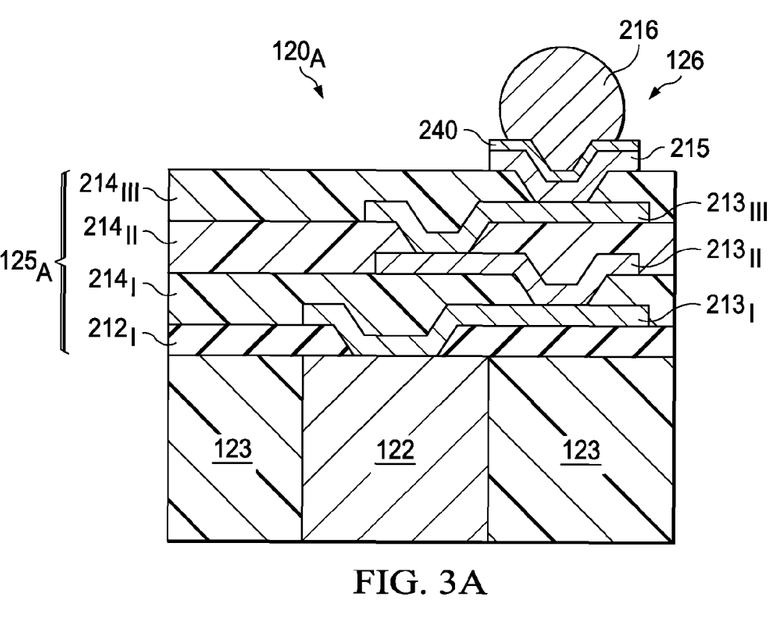
FIGS. 3A-3C show cross-sectional views of die packages with different redistribution structures, in accordance with some embodiments.

Other structures can also be incorporated in package 120'. For example, each of the redistribution structures 124 and 125 could have RDLs, instead of a single layer RDL. FIG. 3A shows a portion of packaged die $120_A$ with a second redistribution structure $125_A$ having three RDLs, $213_I$, $213_{II}$, and $213_{III}$, in accordance with some embodiments. The three RDLs, $213_I$, $213_{II}$, and $213_{III}$ are similar to RDL 213 described above. The second redistribution structure $125_A$ has a compressive dielectric layer 212 and three polymer-based passivation layers, $214_I$, $214_{II}$, and $214_{III}$. The polymer-based passivation layers, $214_I$, $214_{II}$, and $214_{III}$ are similar to polymer-based passivation layer 214 described above. The compressive dielectric layer 212 reduces warpage of the die package. Passivation layers, $214_I$, $214_{II}$, and $214_{III}$, protect die package and also absorb stress exerted on the die package during bonding. An external connector 126 with contact pad 215 and a solder ball 216 is also shown in FIG. 3A. An under bump metallurgy (UBM) layer 240 is formed between contact pad 215 and solder ball 216 to assist bonding, in accordance with some embodiments.

Figure 3B:
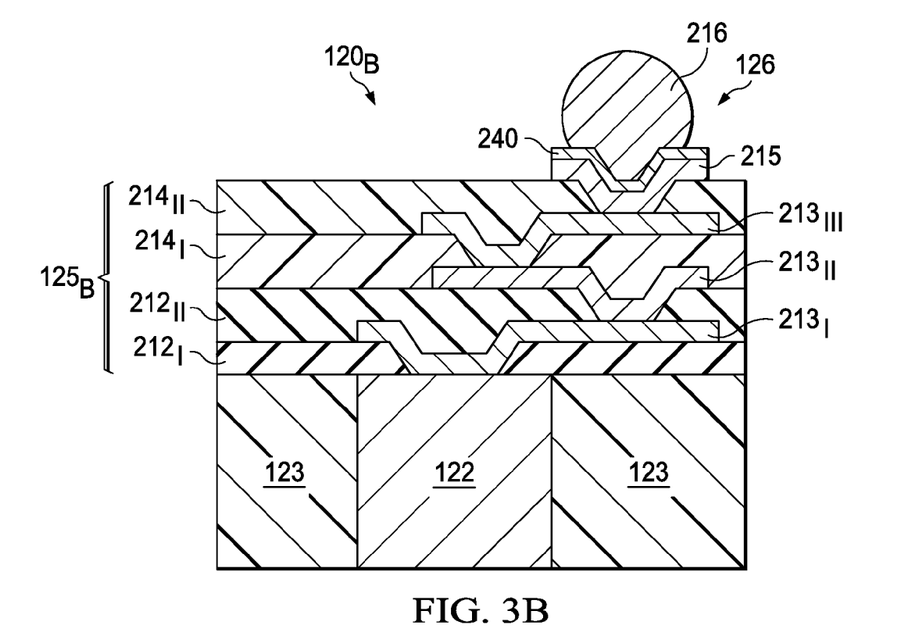

FIG. 3B shows a portion of packaged die $120_B$ with a second redistribution structure $125_B$ having three RDLs, $213_I$, $213_{II}$, and $213_{III}$, in accordance with some embodiments. The three RDLs, $213_I$, $213_{II}$, and $213_{III}$ are similar to RDL 213 described above. The second redistribution structure $125_E$ has two compressive dielectric layers $212_I$ and $212_{II}$ formed next to each other, with layer $212_I$ formed first. The second redistribution structure $125_E$ also has two polymer-based passivation layers, $214_I$, $214_{II}$, formed over compressive dielectric layer $212_{II}$. The compressive dielectric layers $212_I$ and $212_{II}$ are similar to layer 212 described above. The polymer-based passivation layers, $214_I$, and $214_{II}$, are similar to polymer-based passivation layer 214 described above. The compressive dielectric layers $212_I$ and $212_{II}$ reduce warpage of the die package. Passivation layers, $214_I$, and $214_{II}$, protect die package and also absorb stress exerted on the die package.

Figure 3C:
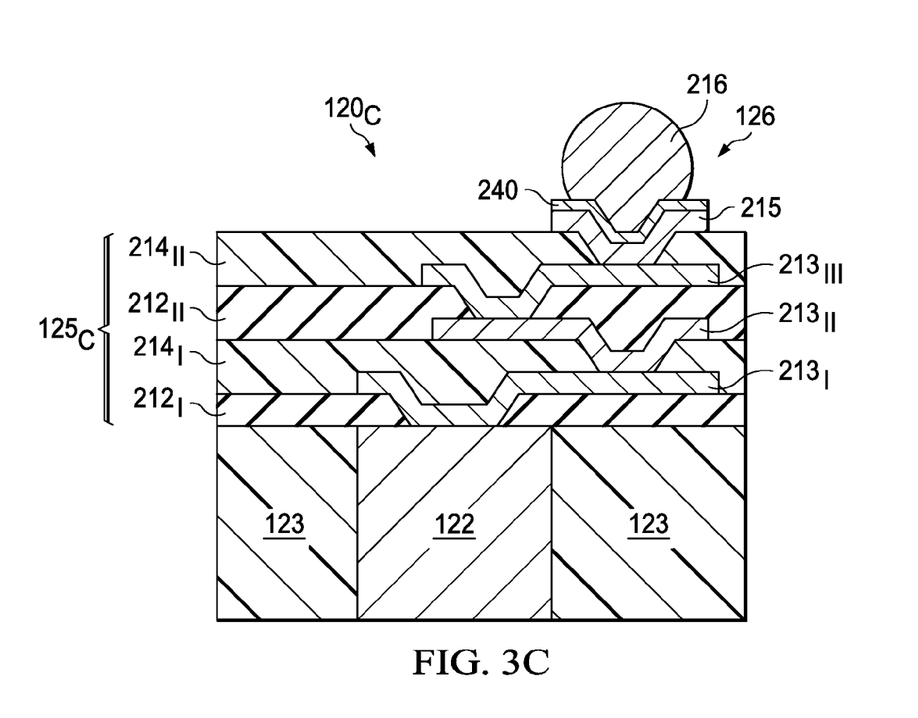

FIG. 3C shows a portion of packaged die $120_C$ with a second redistribution structure $125_C$ having three RDLs, $213_I$, $213_{II}$, and $213_{III}$, in accordance with some embodiments. The three RDLs, $213_I$, $213_{II}$, and $213_{III}$ are similar to RDL 213 described above. The second redistribution structure $125_C$ has compressive dielectric layers $212_I$ and $212_{II}$, with layer $212_I$ formed first and a polymer-based passivation layer $214_I$ between layers $212_I$ and $212_{II}$. Having a polymer-based passivation layer between two compressive dielectric layers could absorb stress exerted on the die package during bonding process. The second redistribution structure $125_C$ also has two polymer-based passivation layers, $214_I$, $214_{II}$, with layer $214_I$ formed over compressive dielectric layer $212_I$ and layer $214_{II}$ formed over layer $212_{II}$. The compressive dielectric layers $212_I$ and $212_{II}$ are similar to layer 212 described above. The polymer-based passivation layers, $214_I$, and $214_{II}$, are similar to polymer-based passivation layer 214 described above. The compressive dielectric layers $212_I$ and $212_{II}$ reduce warpage of the die package. Passivation layers, $214_I$, and $214_{II}$, protect die package and also absorb stress exerted on the die package.

The embodiments described in FIGS. 2A-2I and 3A-3C include two or 4 RDLs in each redistribution structure. However, the number of RDLs can be other than 2 or 4. The number of RDLs could be any integers, such as 1, 3, 5, or more. In forming redistribution structures, such as redistribution structures 124 and/or 125, at least one polymer-based passivation layer is needed in each redistribution structure. If one or more compressive dielectric layers are used in a redistribution structure as passivation layers, one of the compressive dielectric layers is formed closest to the TPVs and semiconductor die. The number of compressive dielectric layers is equal to or less than the number of polymer-like passivation layers in the redistribution structure, in accordance with some embodiments. Sufficient number of layers of polymer-like passivation layers is needed to ensure good stress absorbance. One or more compressive dielectric layers are used to reduce the warpage (or bowing) of the die package.

Figure 4:
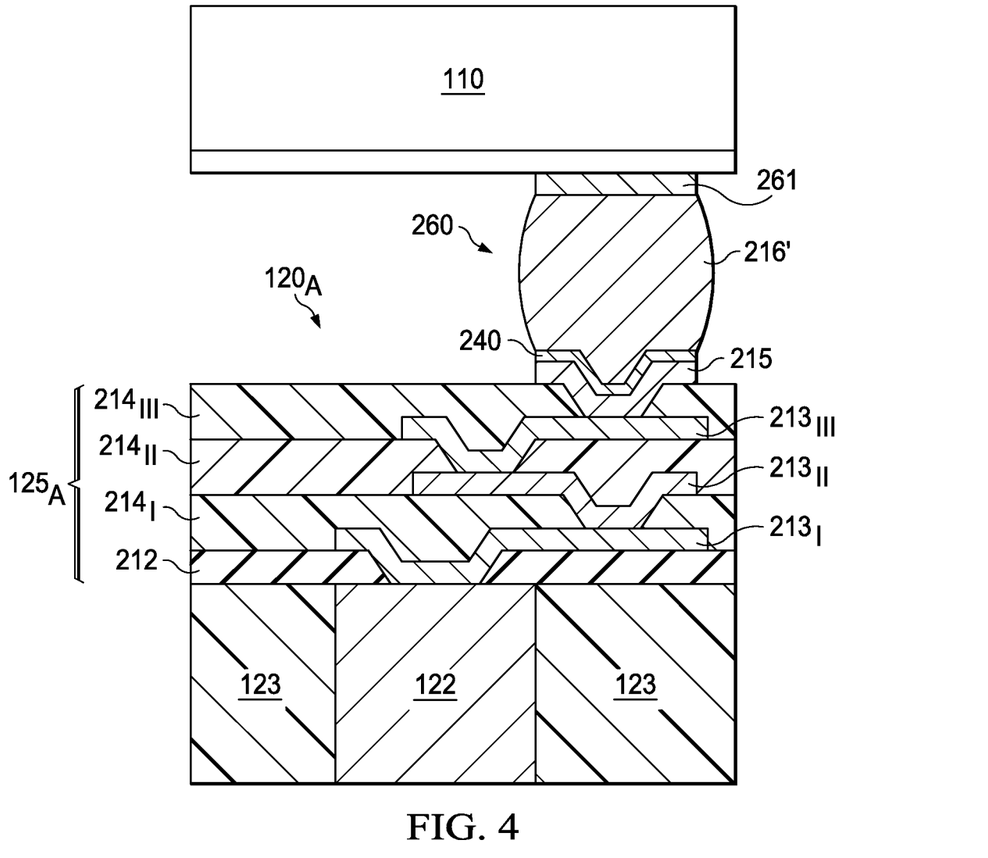
FIG. 4 shows a cross-sectional view of a package on package (PoP) structure, in accordance with some embodiments.

FIG. 4 shows a bonded structure 260 between die package 110 and die package $120_A$, in accordance with some embodiments. Bonding structure 260 includes bonded solder layer 216', which is formed by solder layer 216 of die package $120_A$ and a solder layer of die package 110, which is coupled to contact pad 261. The polymer-based passivation layers $124_I$, $124_{II}$, and 124 provide cushion to stress during the formation (or bonding) of bonded structure 260. The compressive dielectric layer 212 formed by PECVD reduces the bowing and yield of die package $120_A$ and also improves the quality of bonding between die package 110 and die package $120_A$. The compressive layer 212 also improves the adhesion between redistribution structure $125_A$ and materials next to redistribution structure $125_A$ and surrounding the semiconductor die (not shown) in the die package.

Various embodiments of mechanisms for forming a die package and a package on package (PoP) structure using one or more compressive dielectric layers to reduce warpage are provided. The compressive dielectric layer(s) is part of a redistribution structure of the die package and its compressive stress reduces or eliminates bowing of the die package. In addition, the one or more compressive dielectric layers improve the adhesion between redistribution structure and the materials surrounding the semiconductor die. As a result, the yield and reliability of the die package and PoP structure using the die package are improved.

In some embodiments, a method of forming a die package includes forming a conductive column over a first side of a carrier, attaching a semiconductor die to the first side of the carrier, and forming a molding compound over the first side of the carrier. The semiconductor die and the conductive column are embedded in the molding compound. The conductive column provides an electrical connection between a first side of the molding compound and a second side of the molding compound. A second side of the carrier opposite the first side is under a compressive stress. The method also includes forming a first redistribution structure over the semiconductor die, the conductive column, and the molding compound, wherein the forming the first redistribution structure comprises forming a first compressive dielectric layer over the semiconductor die, the conductive column, and the molding compound, forming a first redistribution layer (RDL) over the first compressive dielectric layer, and forming a first passivation layer over the first RDL.

In some embodiments, a method of forming a die package comprises forming a through package via (TPV) over a first side of a first carrier, attaching a semiconductor die to the first side of the first carrier, and forming a molding compound over the first carrier. The molding compound contacts sidewalls of the semiconductor die and the TPV, and fills a space between the semiconductor die and the TPV. A top surface of the TPV is coplanar with a first side of the molding compound. The method also comprises forming a first redistribution structure over the first side of the molding compound, wherein the forming the first redistribution structure comprises depositing a first compressive dielectric layer over the semiconductor die, the TPV, and the first side of the molding compound, wherein the first compressive dielectric layer counteracts a compressive stress along a second side of the first carrier. The forming the first redistribution structure further comprises forming a first redistribution layer (RDL) over the first compressive dielectric layer, and forming a first passivation layer over the first RDL.

In yet some other embodiments, a method of forming a semiconductor package includes embedding a semiconductor die in a molding compound, wherein an inactive side of the semiconductor die is substantially coplanar with a first surface of the molding compound. The method also includes forming a through package via (TPV) extending through the molding compound, and forming a first-side redistribution structure over a second surface of the molding compound. The forming the first-side redistribution structure over a second surface of the molding compound comprises forming a first-side compressive dielectric layer, wherein the first-side compressive dielectric layer has a substantially uniform thickness and contacts the TPV and the molding compound surrounding the semiconductor die, forming at least one first-side redistribution layer (RDL) over the first-side compressive dielectric layer, wherein the at least one first-side RDL is conformal and has a substantially uniform thickness, wherein the at least one first-side RDL is electrically coupled to the semiconductor die via a connector, and wherein the connector is electrically connected to an active side of the semiconductor die and embedded in molding compound, and forming a first-side polymer-based passivation layer over the at least one first-side RDL. The method also includes forming a contact pad with an under bump metallurgy (UBM) layer, wherein the UBM layer has a substantially uniform thickness, wherein a first portion of the UBM layer extends over an outer-most surface of the first-side polymer-based passivation layer, wherein a second portion of the UBM layer extends into an opening of the first-side polymer-based passivation layer, and wherein the contact pad is electrically coupled to the at least one first-side RDL through the opening of the first-side polymer-based passivation layer. The method further comprises forming a metal ball on the contact pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a die package, the method comprising:
   forming a conductive column over a first side of a carrier;
   attaching a semiconductor die to the first side of the carrier;
   forming a molding compound over the first side of the carrier, wherein the semiconductor die and the conductive column are embedded in the molding compound, wherein the conductive column provides an electrical connection between a first side of the molding compound and a second side of the molding compound, and wherein a second side of the carrier opposite the first side is under a compressive stress, conductive contacts of the semiconductor die being exposed;
   after forming the molding compound, forming a first redistribution structure over the semiconductor die, the conductive column, and the molding compound, wherein the forming the first redistribution structure comprises:
  forming a first compressive dielectric layer over the semiconductor die, the conductive column, and the molding compound;
  forming a first redistribution layer (RDL) over the first compressive dielectric layer, the first RDL being electrically coupled to the conductive contacts of the semiconductor die; and
  forming a first passivation layer over the first RDL; and
after forming the first redistribution structure, removing the carrier.

2. The method of claim 1, wherein the first compressive dielectric layer counteracts the compressive stress along the second side of the carrier.

3. The method of claim 1, wherein the first compressive dielectric layer comprises SiN or SiON.

4. The method of claim 1, wherein the first compressive dielectric layer has a thickness in a range from about 0.5 µm to about 7 µm.

5. The method of claim 1, wherein the first compressive dielectric layer has a stress in a range from about 300 MPa to about 700 MPa.

6. The method of claim 1, wherein a stress and a thickness of the first compressive dielectric layer are tuned to counteract the compressive stress along the second side of the carrier.

7. The method of claim 1, wherein the first compressive dielectric layer is formed by a low-temperature plasma-enhanced chemical vapor deposition (LT PECVD) process.

8. The method of claim 7, wherein the LT PECVD process is performed at a temperature lower than about 400° C.

9. The method of claim 1, wherein the forming the first redistribution structure further comprises:
  forming a second compressive dielectric layer over the first compressive dielectric layer.

10. The method of claim 9, wherein the second compressive dielectric layer contacts the first compressive dielectric layer.

11. The method of claim 9, wherein the second compressive dielectric layer is spaced apart from the first compressive dielectric layer.

12. The method of claim 1, wherein the forming the first redistribution structure further comprises:
  forming a second RDL over the first passivation layer; and
  forming a second passivation layer over the second RDL.

13. A method of forming a die package, the method comprising:
  forming a through package via (TPV) over a first side of a first carrier;
  attaching a semiconductor die to the first side of the first carrier;
  forming a molding compound over the first carrier, wherein the molding compound is interposed between sidewalls of the semiconductor die and the TPV, and wherein a top surface of the TPV is level with a first side of the molding compound; and
  forming a first redistribution structure over the first side of the molding compound, wherein the forming the first redistribution structure comprises:
    depositing a first compressive dielectric layer over the semiconductor die, the TPV, and the first side of the molding compound, wherein the first compressive dielectric layer counteracts a compressive stress along a second side of the first carrier;
    forming a first redistribution layer (RDL) over the first compressive dielectric layer; and
    forming a first passivation layer over the first RDL;
  forming a first external connector over the first passivation layer;
  attaching the first external connector to a second carrier;
  removing the first carrier; and
  forming a second redistribution structure over a second side of the molding compound opposite the first side, wherein the forming the second redistribution structure comprises:
    forming a second passivation layer over the semiconductor die, the TPV, and the second side of the molding compound;
    forming a second RDL over the second passivation layer; and
    forming a third passivation layer over the second RDL.

14. The method of claim 13, wherein a thickness and a stress of the first compressive dielectric layer is tuned to counteract the compressive stress along the second side of the first carrier.

15. The method of claim 13, wherein the forming the first redistribution structure further comprises:
  forming a second compressive dielectric layer over the first compressive dielectric layer.

16. The method of claim 13, wherein the second passivation layer comprise a compressive dielectric material.

17. The method of claim 13, wherein the forming the first redistribution structure further comprises:
  forming a polymer layer over the first compressive dielectric layer; and
  forming a second compressive dielectric layer over the polymer layer.

18. The method of claim 13, wherein the forming the first redistribution structure further comprises:
  forming a second compressive dielectric layer over the first compressive dielectric layer; and
  forming a polymer layer over the second compressive dielectric layer.

19. A method of forming a semiconductor package, the method comprising:
  embedding a semiconductor die in a molding compound, wherein an inactive side of the semiconductor die is substantially coplanar with a first surface of the molding compound;
  forming a through package via (TPV) extending through the molding compound;
  forming a first-side redistribution structure over a second surface of the molding compound, the forming the first-side redistribution structure comprising:
    forming a first-side compressive dielectric layer, wherein the first-side compressive dielectric layer has a substantially uniform thickness and contacts the TPV and the molding compound surrounding the semiconductor die;
    forming at least one first-side redistribution layer (RDL) over the first-side compressive dielectric layer, wherein the at least one first-side RDL is electrically coupled to the semiconductor die via a connector, and wherein the connector is electrically connected to an active side of the semiconductor die and embedded in molding compound; and
    forming a first-side polymer-based passivation layer over the at least one first-side RDL;
  forming a contact pad with an under bump metallurgy (UBM) layer, wherein the UBM layer has a substantially uniform thickness, wherein a first portion of the UBM layer extends over an outermost surface of the first-side polymer-based passivation layer, wherein a second portion of the UBM layer extends into an opening of the first-side polymer-based passivation layer, and wherein the contact pad is electrically coupled to the at least one first-side RDL through the opening of the first-side polymer-based passivation layer; and forming a metal ball on the contact pad.

20. The method of claim 19, wherein the first-side compressive dielectric layer is a first first-side compressive dielectric layer, and wherein the forming the first-side redistribution structure further comprises:

forming a second first-side compressive dielectric layer over the first first-side compressive dielectric layer.

* * * * *